(12) United States Patent
Chen et al.

(10) Patent No.: US 8,721,833 B2
(45) Date of Patent: May 13, 2014

(54) VARIABLE CAPACITANCE CHAMBER COMPONENT INCORPORATING FERROELECTRIC MATERIALS AND METHODS OF MANUFACTURING AND USING THEREOF

(75) Inventors: Zhiying Chen, Austin, TX (US); Jianping Zhao, Austin, TX (US); Lee Chen, Cedar Creek, TX (US); Merritt Funk, Austin, TX (US); Radha Sundararajan, Dripping Springs, TX (US)

(73) Assignee: Tokyo Electron Limited, Minato-Ku, Tokyo (JP)

( * ) Notice: Subject to any disclaimer, the term of this patent is extended or adjusted under 35 U.S.C. 154(b) by 95 days.

(21) Appl. No.: 13/366,341

(22) Filed: Feb. 5, 2012

(65) Prior Publication Data
US 2013/0203258 A1 Aug. 8, 2013

(51) Int. Cl.
*H01L 21/306* (2006.01)
(52) U.S. Cl.
USPC ............ 156/345.1; 118/719; 216/67; 216/71; 156/345.51; 427/457
(58) Field of Classification Search
None
See application file for complete search history.

(56) References Cited

U.S. PATENT DOCUMENTS

| | | |
|---|---|---|
| 7,001,482 B2 | 2/2006 | Landis |
| 7,582,186 B2 | 9/2009 | Strang et al. |
| 2003/0201069 A1 | 10/2003 | Johnson |
| 2004/0261946 A1* | 12/2004 | Endoh et al. ............. 156/345.15 |
| 2005/0120960 A1 | 6/2005 | Chen |
| 2005/0230049 A1 | 10/2005 | Nishio et al. |
| 2006/0096703 A1 | 5/2006 | Moriya et al. |
| 2006/0169209 A1 | 8/2006 | Miyano |
| 2006/0170078 A1 | 8/2006 | Moriya et al. |
| 2007/0000614 A1 | 1/2007 | Hatamura et al. |
| 2008/0041306 A1* | 2/2008 | Itagaki et al. ................. 118/665 |
| 2008/0277768 A1 | 11/2008 | Moriya et al. |
| 2009/0151870 A1 | 6/2009 | Urakawa |
| 2009/0242127 A1 | 10/2009 | Koshimizu et al. |
| 2009/0278231 A1* | 11/2009 | Nagai et al. .................... 257/532 |
| 2010/0203736 A1 | 8/2010 | Ichino et al. |
| 2010/0263196 A1 | 10/2010 | Miyano |
| 2010/0272982 A1* | 10/2010 | Dickinson et al. ......... 428/304.4 |
| 2010/0300622 A1 | 12/2010 | Yatsuda et al. |
| 2010/0304572 A1 | 12/2010 | Koshimizu |
| 2011/0000883 A1 | 1/2011 | Endoh et al. |

FOREIGN PATENT DOCUMENTS

JP  2008042117 A  2/2008

OTHER PUBLICATIONS

Machine English language translation of JP 2008-042117, published Feb. 2008.

* cited by examiner

*Primary Examiner* — Julio J Maldonado
*Assistant Examiner* — Joseph Galvin, III

(57) ABSTRACT

A replaceable chamber element for use in a plasma processing system, such as a plasma etching system, is described. The replaceable chamber element includes a chamber component configured to be exposed to plasma in a plasma processing system, wherein the chamber component is fabricated of a ferroelectric material.

15 Claims, 9 Drawing Sheets

VARIABLE CAPACITANCE CHAMBER COMPONENT INCORPORATING FERROELECTRIC MATERIALS AND METHODS OF MANUFACTURING AND USING THEREOF

CROSS-REFERENCE TO RELATED APPLICATIONS

This application is related to co-pending U.S. patent application Ser. No. 13/366,340, entitled "VARIABLE CAPACITANCE CHAMBER COMPONENT INCORPORATING A SEMICONDUCTOR JUNCTION AND METHODS OF MANUFACTURING AND USING THEREOF", filed on even date herewith. The entire content of this application is herein incorporated by reference in its entirety.

FIELD OF INVENTION

The invention relates to a replaceable chamber element for use in a plasma processing system, and methods for manufacturing the replaceable chamber element and performing a plasma-assisted process using the replaceable chamber element.

BACKGROUND OF THE INVENTION

The fabrication of integrated circuits (IC) in the semiconductor industry typically employs plasma to create and assist surface chemistry within a vacuum processing system necessary to remove material from and deposit material on a substrate. In general, plasma is formed within the processing system under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the system (e.g., etching processes where materials are removed from the substrate or deposition processes where materials are added to the substrate).

Although the formation of a population of charged species (ions, etc.) and chemically reactive species is necessary for performing the function of the plasma processing system (i.e., material etch, material deposition, etc.) at the substrate surface, other chamber component surfaces on the interior of the plasma processing chamber are exposed to the physically and chemically active plasma and, in time, can erode. The erosion of exposed chamber components in the plasma processing system can lead to a gradual degradation of the plasma processing performance and ultimately to complete failure of the system.

As an example, during plasma etching for semiconductor device fabrication, the termination of the peripheral edge of the substrate is important and, when not addressed properly, can change plasma properties and affect etching uniformity. A chamber component, known as a focus ring, is located beyond the peripheral edge of the substrate and, dependent on the material composition of the focus ring, it may spread or confine plasma above the substrate to improve etching performance, such as etching uniformity, especially at the peripheral edge of the substrate. However, the focus ring is consumed during plasma etching, which in turn degrades etching uniformity. And, as a consequence, the focus ring must be replaced about every 200-400 hours the plasma processing system is in operation.

As another example, during plasma etching for semiconductor device fabrication, chamber matching is also a critical concern. The consumption of chamber components (e.g., focus ring, cover ring, electrode plate, etc.), the deposition of polymer on chamber components (e.g., deposition shield, etc.), and chamber capacity change the capacitance of plasma processing chamber, which results in variable plasma properties as well as variable etching uniformity.

SUMMARY OF THE INVENTION

Embodiments of the invention relate to a replaceable chamber element for use in a plasma processing system, and methods for manufacturing the replaceable chamber element and performing a plasma-assisted process using the replaceable chamber element. Embodiments of the invention further relate to a replaceable chamber element having a variable capacitance.

According to one embodiment, a replaceable chamber element for use in a plasma processing system, such as a plasma etching system, and a method of manufacturing are described. The replaceable chamber element includes a chamber component configured to be exposed to plasma in a plasma processing system, wherein the chamber component is fabricated of a ferroelectric material.

According to another embodiment, a method for performing a plasma-assisted process is described. The method includes disposing a chamber component in a plasma process system, wherein the chamber component is composed of a ferroelectric material. The method further includes forming plasma for performing a plasma-assisted process in said plasma processing system.

DETAILED DESCRIPTION OF SEVERAL EMBODIMENTS

Figure 1A:
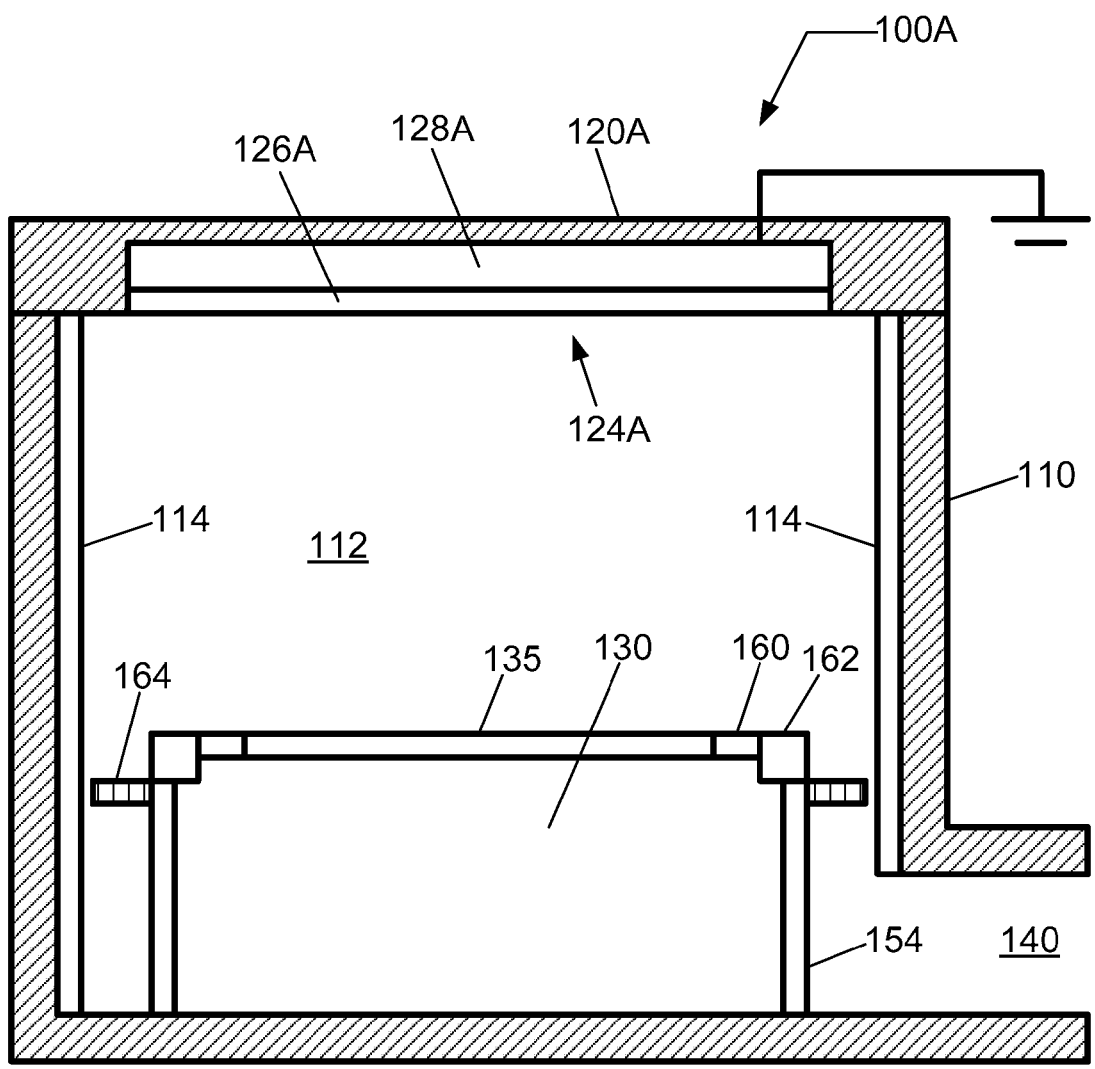
FIGS. 1A through 1C provide schematic illustrations of a plasma processing system according to several embodiments.

A replaceable chamber element for use in a plasma processing system is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As described above, plasma processing systems and, in particular, plasma etching systems, contain one or more replaceable chamber elements exposed to plasma that require periodic replacement or refurbishment due to plasma erosion and consumption. For example, the one or more replaceable chamber elements may include a focus ring, a shield ring, a deposition shield (or chamber liner), a baffle plate, a bellows shield, an electrode plate, or an antenna window. According to various embodiments, a replaceable chamber element having a variable capacitance is described that, among other things, may be utilized to adjust one or more plasma properties, such as plasma density, to achieve any one of the following: (i) alter plasma uniformity and etching uniformity; (ii) improve plasma processing chamber matching; (iii) reduce the seasoning time following the cleaning of the plasma processing chamber; (iv) increase lifetime of the replaceable chamber element by compensating for plasma erosion and consumption; and (v) improve substrate-to-substrate and lot-to-lot matching.

Therefore, according to an embodiment, a plasma processing system 100A configured to perform a plasma-assisted process on a substrate 135 is depicted in FIG. 1A. The plasma processing system 100A comprises a plasma processing chamber 110, an upper assembly 120A, an electrode plate/antenna assembly 124A, a substrate holder 130 for supporting substrate 135, a pumping duct 140 coupled to a vacuum pump (not shown) for providing a reduced pressure atmosphere in plasma processing chamber 110, and one or more replaceable chamber elements (160, 162, 164, 126A, 154, 114) having a variable capacitance.

Plasma processing chamber 110 can facilitate the formation of plasma in a process space 112 adjacent substrate 135. Plasma can be utilized to create materials specific to a predetermined materials process, and/or to aid the removal of material from the exposed surfaces of substrate 135. The plasma processing system 100A may be configured to process substrates of any size, such as 200 mm substrates, 300 mm substrates, 450 mm substrates, or larger. For example, the plasma processing system 100A may comprise a plasma etching system.

In the illustrated embodiment of FIG. 1A, upper assembly 120A may provide a grounded electrode opposite substrate 135. The upper assembly 120A comprises electrode plate/antenna assembly 124A that includes an electrode plate 126A and an electrode 128A. Electrode 128A may be electrically coupled to ground, as shown, and electrode plate 126A may be composed of a material compatible with plasma in process space 112. Due to the erosive nature of plasma, electrode plate 126A may be consumed and may require periodic replacement or refurbishment. For example, electrode plate 126A may be a replaceable element composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Additionally, the ferroelectric material may be arranged between two electrodes. Furthermore, the electrode plate 126A may include a protective layer formed on an exterior surface arranged to be exposed to plasma. The electrode plate 126A may be removably fastened to electrode 128A.

Figure 1B:
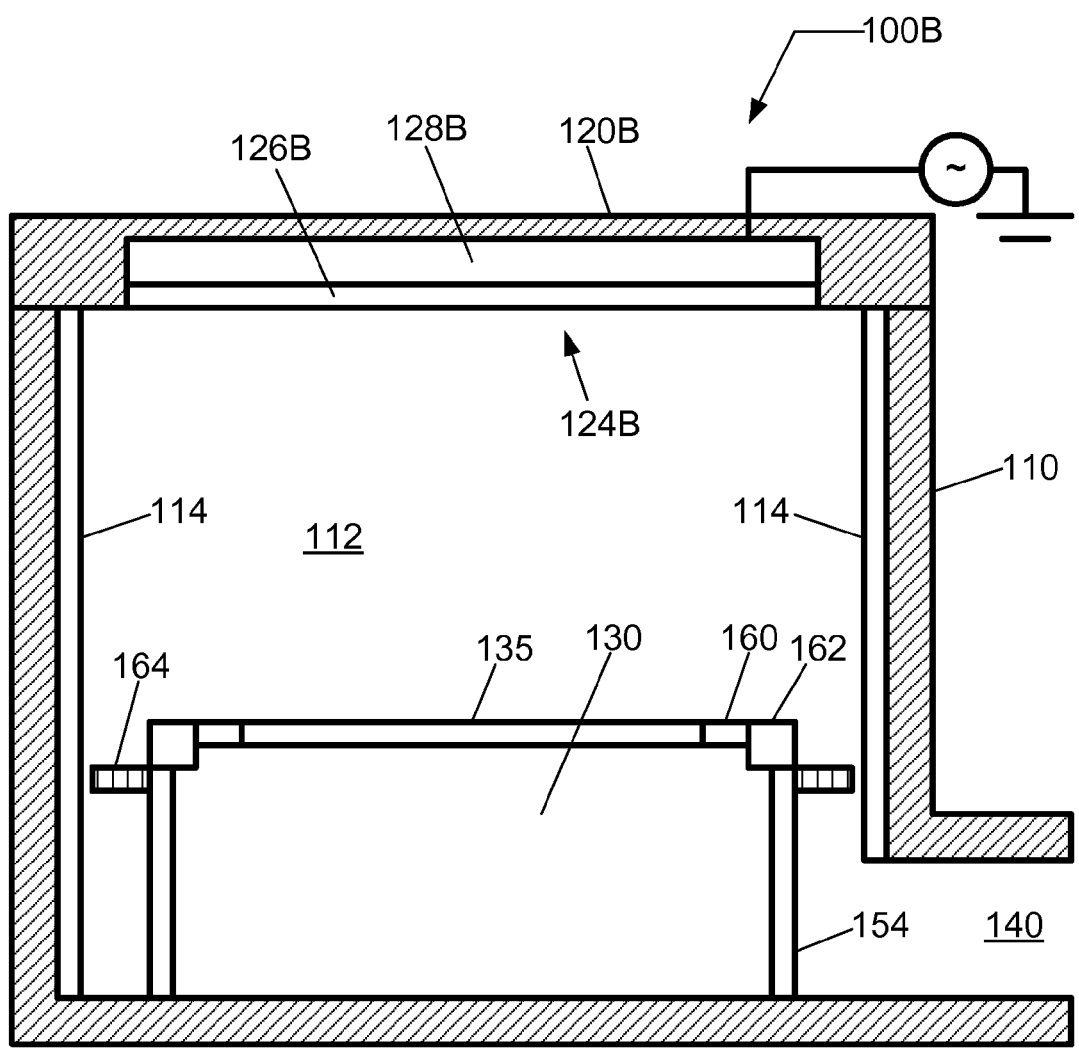

Alternatively, in the illustrated embodiment of FIG. 1B, an upper assembly 120B of a plasma processing system 100B is shown. Upper assembly 120B may provide a powered RF electrode opposite substrate 135 for plasma production. The upper assembly 120B comprises an electrode plate/antenna assembly 124B that includes an electrode plate 126B and an electrode 128B. Electrode 128B may be electrically coupled to a source of radio frequency (RF) energy, such as an RF generator, as shown, and electrode plate 126B may be composed of a material compatible with plasma in process space 112. Due to the erosive nature of plasma, electrode plate 126B may be consumed and may require periodic replacement or refurbishment. For example, electrode plate 126B may be a replaceable element composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Additionally, the ferroelectric material may be arranged between two electrodes. Furthermore, the electrode plate 126B may include a protective layer formed on an exterior surface arranged to be exposed to plasma. The electrode plate 126B may be removably fastened to electrode 128B.

As shown in FIGS. 1A and 1B, the plasma processing system (100A, 100B) may be configured as a capacitively coupled plasma (CCP) system. Alternatively, the plasma processing system (100A, 100B) may be configured as an inductively coupled plasma (ICP) system.

Figure 1C:
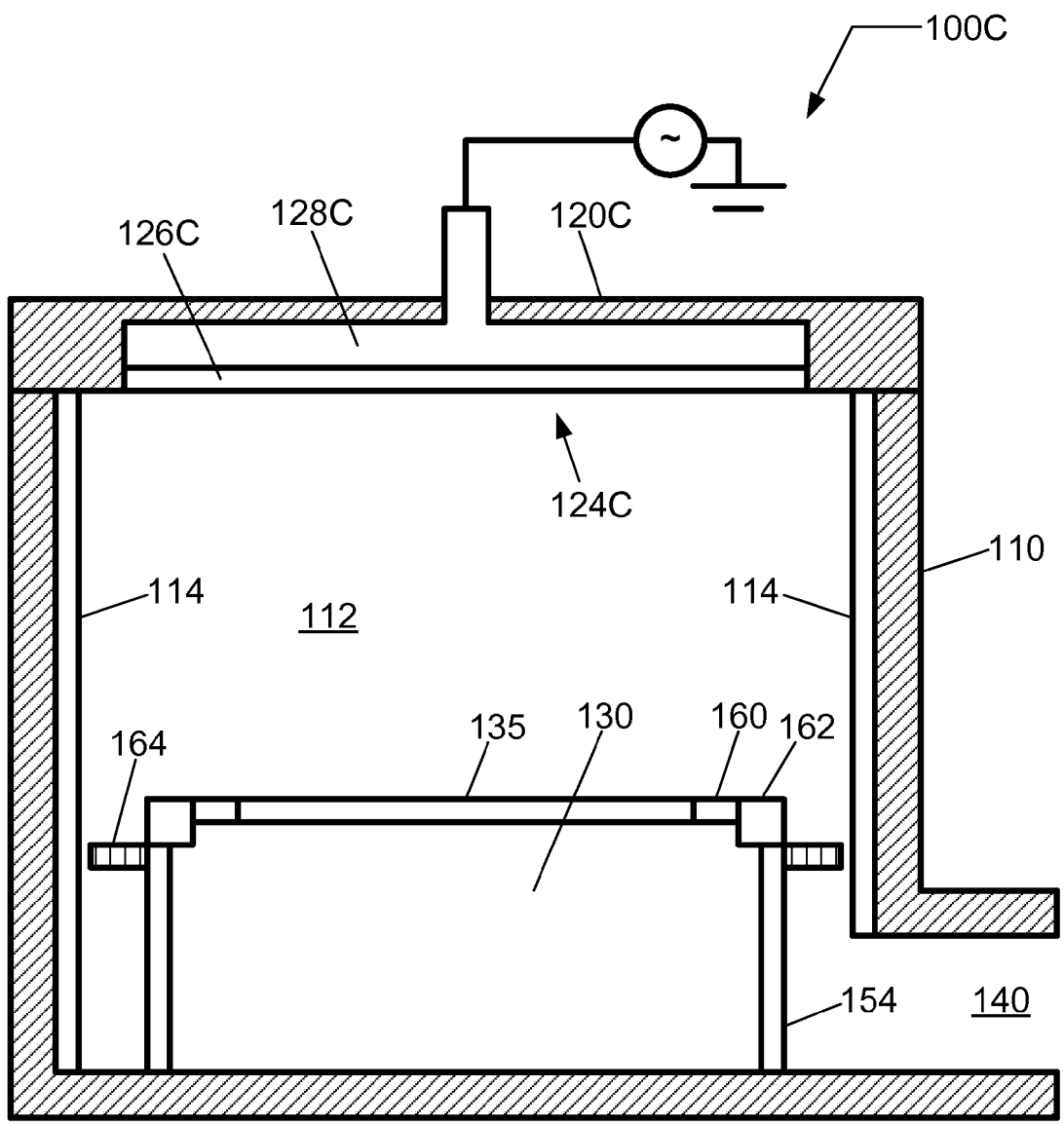

Alternatively yet, in the illustrated embodiment of FIG. 1C, an upper assembly 120C of a plasma processing system 100C is shown. Upper assembly 120C may provide a powered microwave antenna opposite substrate 135 for plasma production. The upper assembly 120C comprises an electrode plate/antenna assembly 124C that includes an antenna window 126C and an antenna 128C. Antenna 128C may be electrically coupled to a source of radio frequency (RF) energy, such as a microwave generator, as shown, and antenna window 126C may be composed of a material compatible with plasma in process space 112. Due to the erosive nature of plasma, antenna window 126C may be consumed and may require periodic replacement or refurbishment. For example, antenna window 126C may be a replaceable element composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Additionally, the ferroelectric material may be arranged between two electrodes. Furthermore, the antenna window 126C may include a protective layer formed on an exterior surface arranged to be exposed to plasma. The antenna window 126C may be removably fastened to antenna 128C.

As shown in FIG. 1C, the plasma processing system 100C may be configured as a surface wave plasma (SWP) system. Upper assembly 120C may include a slotted plane antenna (SPA), such as a radial line slot antenna (RLSA).

Although not shown in FIGS. 1A through 1C, a direct current (DC) power supply may be coupled to the upper assembly (120A, 120B, 120C) opposing substrate 135. The DC power supply may include a variable DC power supply. Additionally, the DC power supply may include a bipolar DC power supply. The DC power supply may further include a system configured to perform at least one of monitoring, adjusting, or controlling the polarity, current, voltage, or on/off state of the DC power supply. Once plasma is formed, the DC power supply may facilitate the formation of an electron beam. An electrical filter (not shown) may be utilized to de-couple RF power from the DC power supply.

For example, the DC voltage applied to upper assembly (120A, 120B, 120C) by the DC power supply may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper assembly (120A, 120B, 120C).

Referring to FIGS. 1A through 1C, the plasma processing chamber 110 may include a chamber liner or deposition shield 114 configured to be coupled to at least a portion of an interior surface of the plasma processing chamber 110. Due to the erosive nature of plasma, deposition shield 114 may be consumed and may require periodic replacement or refurbishment. The inventors suspect that the deposition of polymer on the deposition shield 114 during etching will have less influence on the etching uniformity and chamber matching when capacitance adjustment is utilized. As a result, the frequency for system maintenance, including wet clean, will be decreased. For example, deposition shield 114 may be a replaceable element composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Additionally, the ferroelectric material may be arranged between two electrodes. Furthermore, the deposition shield 114 may include a protective layer formed on an exterior surface arranged to be exposed to plasma. The deposition shield 114 may be removably fastened to plasma processing chamber 110.

Referring to FIGS. 1A through 1C, substrate holder 130 further comprises a focus ring 160, and may optionally comprise a shield ring 162 and a bellows shield 154. Due to the erosive nature of plasma, focus ring 160 may be consumed and may require periodic replacement or refurbishment. For example, focus ring 160 may be a replaceable element composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Additionally, the ferroelectric material may be arranged between two electrodes. Furthermore, the focus ring 160 may include a protective layer formed on an exterior surface arranged to be exposed to plasma. The focus ring 160 may be removably fastened to substrate holder 130.

Additionally, substrate 135 can be affixed to the substrate holder 130 via a clamping system (not shown), such as a mechanical clamping system or an electrical clamping system (e.g., an electrostatic clamping system). Furthermore, substrate holder 130 can include a heating system (not shown) or a cooling system (not shown) that is configured to adjust and/or control the temperature of substrate holder 130 and substrate 135. The heating system or cooling system may comprise a re-circulating flow of heat transfer fluid that receives heat from substrate holder 130 and transfers heat to a heat exchanger system (not shown) when cooling, or transfers heat from the heat exchanger system to substrate holder 130 when heating. In other embodiments, heating/cooling elements, such as resistive heating elements, or thermo-electric heaters/coolers can be included in the substrate holder 130, as well as the chamber wall of the plasma processing chamber 110 and any other component within the plasma processing system (100A, 100B, 100C).

Furthermore, a heat transfer gas can be delivered to the backside of substrate 135 via a backside gas supply system in order to improve the gas-gap thermal conductance between substrate 135 and substrate holder 130. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 135.

In the embodiments shown in FIGS. 1A through 1C, substrate holder 130 can comprise a substrate holder electrode (not shown) through which RF power is optionally coupled to the processing plasma in process space 112. For example, substrate holder 130 can be electrically biased at a RF voltage via the transmission of RF power from a RF generator (not shown) through an optional impedance match network to substrate holder 130. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of the substrate holder electrode at a RF voltage may be pulsed using pulsed bias signal controller (not shown). The RF power output from the RF generator may be pulsed between an off-state and an on-state, for example.

Alternately, RF power is applied to the substrate holder electrode at multiple frequencies. Furthermore, impedance match network can improve the transfer of RF power to plasma in plasma processing chamber 110 by reducing the reflected power. Match network topologies (e.g. L-type, π-type, T-type, etc.) and automatic control methods are well known to those skilled in the art.

The upper assembly (120A, 120B, 120C) may include a gas distribution system (not shown). The gas distribution system may comprise a showerhead design for introducing a mixture of process gases. Alternatively, gas distribution system may comprise a multi-zone showerhead design for introducing a mixture of process gases and adjusting the distribution of the mixture of process gases above substrate 135. For example, the multi-zone showerhead design may be configured to adjust the process gas flow or composition to a substantially peripheral region above substrate 135 relative to the amount of process gas flow or composition to a substantially central region above substrate 135. The gas distribution system may be integrated with the electrode plate (126A, 126B) or antenna window 126C, for example.

A vacuum pumping system may be coupled to pumping duct 140. For example, the vacuum pumping system may include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 110.

The plasma processing chamber 110 may include a baffle plate 164 configured to be coupled to an entrance to the pumping duct 140 or an annular region surrounding a peripheral edge of substrate holder 130 in plasma processing chamber 110. Due to the erosive nature of plasma, baffle plate 164 may be consumed and may require periodic replacement or refurbishment. For example, baffle plate 164 may be a replaceable element composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Additionally, the ferroelectric material may be arranged between two electrodes. Furthermore, the baffle plate 164 may include a protective layer formed on an exterior surface arranged to be exposed to plasma. The baffle plate 164 may be removably fastened to substrate holder 130 or plasma processing chamber 110.

Any one of the replaceable chamber elements, such as focus ring 160, shield ring 162, electrode plate (126A, 126B), antenna window 126C, deposition shield 114, baffle plate 164, bellows shield 154, etc., may include a protective layer, such as a coating, applied to at least a portion of an exterior surface. The coating may be composed of silicon, un-doped silicon, doped silicon, quartz, silicon carbide, silicon nitride, carbon, alumina, sapphire, ceramic, fluoropolymer, or polyimide. Additionally, the coating may include a spray coating. The coating may include at least one of a Group III element (Group III refers to the classical or old IUPAC notation in the Periodic Table of Elements; according to the revised or new IUPAC notation, this Group would refer to Group 13) and a Lanthanon element, for example. The coating may comprise at least one of $Al_2O_3$, Yttria ($Y_2O_3$), $Sc_2O_3$, $Sc_2F_3$, $YF_3$, $La_2O_3$, $CeO_2$, $Eu_2O_3$, and $Dy_2O_3$. Methods of applying spray coatings are well known to those skilled in the art of surface material treatment.

As described above with reference to FIGS. 1A through 1C, plasma processing system (100A, 100B, 100C) may include one or more replaceable chamber elements, such as focus ring 160, shield ring 162, electrode plate (126A, 126B), antenna window 126D, deposition shield 114, baffle plate 164, bellows shield 154, etc. At least one replaceable chamber element possesses a variable capacitance. The variable capacitance, replaceable chamber element is designed to include a ferroelectric material. Therein, when a bias voltage is applied across the ferroelectric material, the capacitance is varied.

Figure 2:
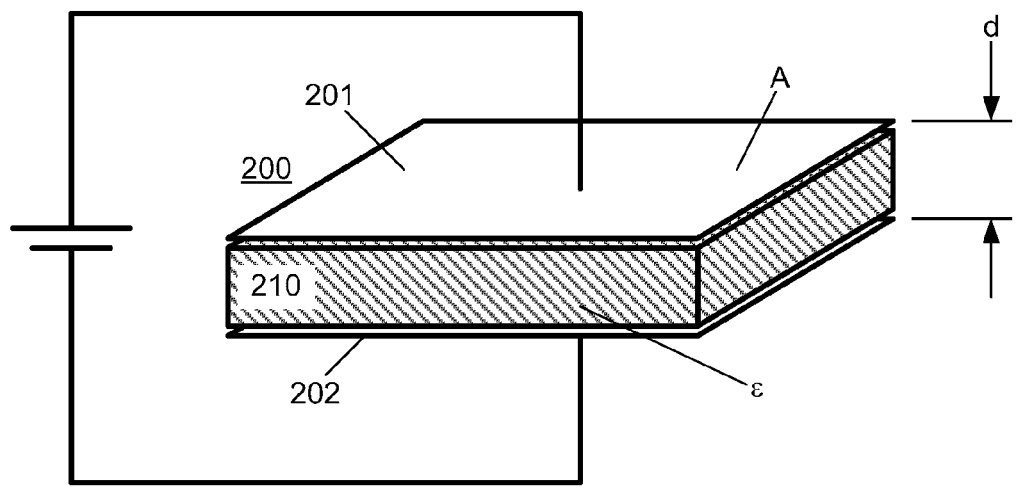
FIG. 2 provides an illustration of a method of varying the capacitance of a replaceable chamber element according to an embodiment.

As shown in FIG. 2, a replaceable chamber element for use in a plasma processing system is illustrated. The replaceable chamber element includes a chamber component 200 configured to be exposed to plasma in a plasma processing system, wherein the chamber component 200 includes a ferroelectric material 210 disposed between a first electrode 201 and a second electrode 202, wherein the ferroelectric material behaves as a capacitor having a capacitance $C=\in A/d$, wherein $\in$ is the dielectric constant of the ferroelectric material and A is the area.

Figure 3:
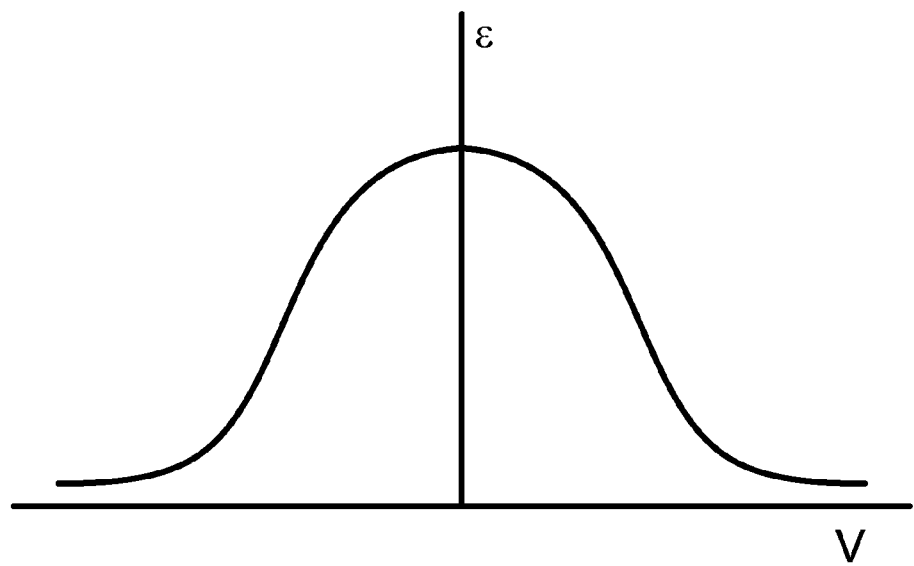
FIG. 3 illustrates the dependence of dielectric constant on voltage applied across a ferroelectric material.

As illustrated in FIG. 3, when a bias voltage is applied across the ferroelectric material between the first electrode 201 and the second electrode 202, the dielectric constant ($\in$) is varied.

Figure 4:
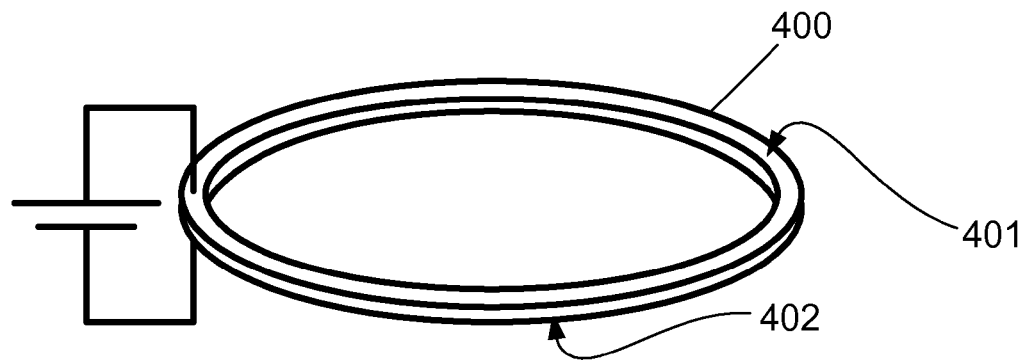
FIG. 4 provides an illustration of a focus ring and a method of fabricating according to an embodiment.

Referring now to FIG. 4, a focus ring 400 and a method of fabricating thereof are illustrated according to an embodiment. The focus ring 400 is composed of a ferroelectric material, wherein a bias voltage may be applied across the ferroelectric material between a first electrode 401 and a second electrode 402. The first electrode 401 and the second electrode 402 may be composed of a metal-containing material or a Si-containing material, such as doped Si.

The focus ring 400 is composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Furthermore, focus ring 400 may include a protective layer formed on an exterior surface arranged to be exposed to plasma.

Figure 5A:
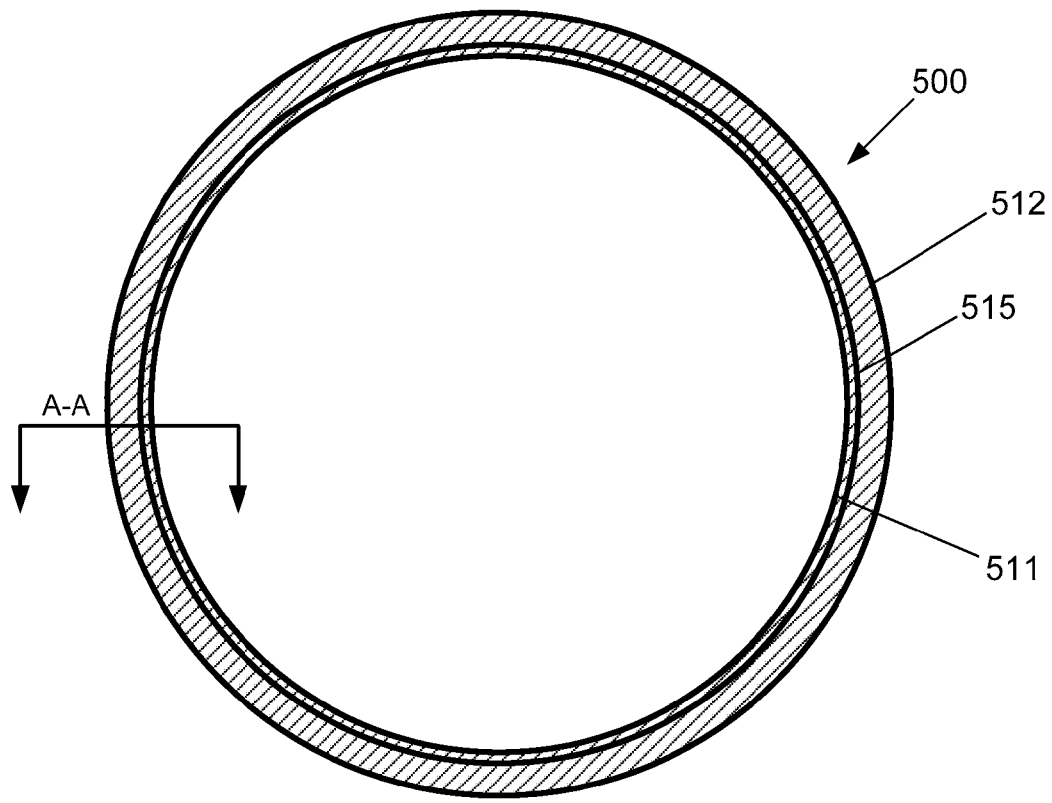
FIGS. 5A and 5B provide a top view of a focus ring and an exploded cross-sectional view of an implementation of a variable capacitance focus ring in a plasma processing system according to an embodiment.
Figure 5B:
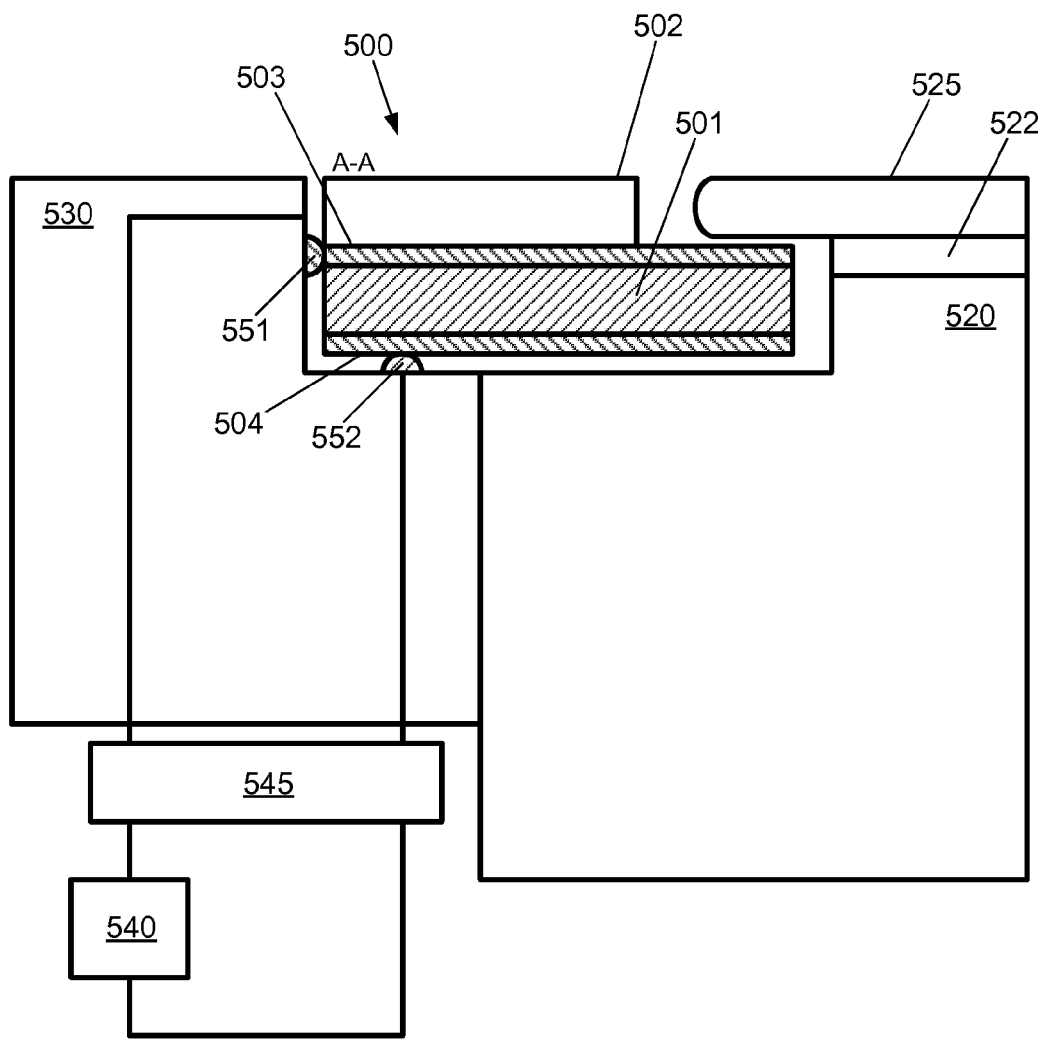

Referring now to FIGS. 5A and 5B, a top view of a focus ring and an exploded cross-sectional view of an implementation of a variable capacitance focus ring in a plasma processing system is depicted according to an embodiment. As shown in FIG. 5A, a focus ring 500 includes an inner radial edge 511 and an outer radial edge 512. Focus ring 500 further includes an optional step 515 located at the inner radial edge 511, wherein step 515 is configured to underlie the peripheral edge of a substrate 525.

FIG. 5B provides an exploded cross-sectional view of substrate holder 520 including section A-A of focus ring 500. Substrate holder 520 may include electrostatic clamp (ESC) layer 522 that includes an ESC electrode for electrically clamping substrate 525 to substrate holder 520. Additionally, substrate holder 520 may include edge insulator 530 through which electrical connection to focus ring 500 may be included.

Focus ring 500 includes a ferroelectric material 501 disposed between a first electrode 503 and a second electrode 504. Additionally, the first electrode 503 is configured to be coupled to a first contact electrode 551 at a first voltage, and the second electrode 504 is configured to be coupled to a second contact electrode 552 at a second voltage. Furthermore, substrate holder 520 includes a voltage source 540 having a first terminal coupled to the first contact electrode 551 and a second terminal coupled to the second contact electrode 552, wherein a voltage difference between the first terminal and the second terminal is used to change the dielectric constant of ferroelectric material 501.

The voltage source 540 may include a direct current (DC) or alternating current (AC) voltage source. The voltage source 540 may include a variable DC power supply, and may include a bipolar DC power supply. The voltage source 540 may further include a filter 545 configured to protect the voltage source 540 from RF power relating to plasma formation.

Further yet, as described above, a protective layer 502 may be formed on an exterior surface of focus ring 500 arranged to be exposed to plasma. The protective layer 502 may include a Si-containing material, such as Si, $SiO_2$, $Si_3N_4$, etc. Additionally, the protective layer 502 may include doped or un-doped Si. Furthermore, the protective layer 502 may include a spray coating. The protective layer 502, if compatible with plasma and conductive, may serve as the first electrode 503.

Figure 6:
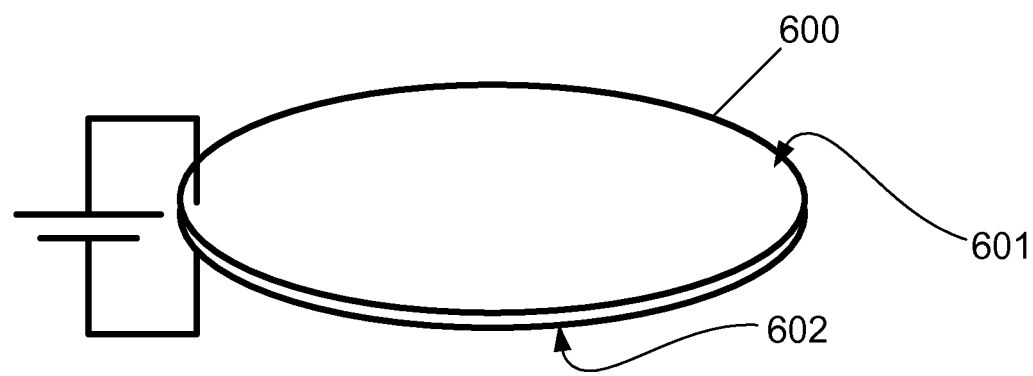
FIG. 6 provides an illustration of an electrode plate and a method of fabricating according to various embodiments.

Referring now to FIG. 6, an electrode plate 600 and a method of fabricating thereof are illustrated according to an embodiment. While this embodiment is described in the context of an electrode plate, it may also be applicable to an antenna window or a baffle plate. The electrode plate 600 is composed of a ferroelectric material, wherein a bias voltage may be applied across the ferroelectric material between a first electrode 601 and a second electrode 602. The first electrode 601 and the second electrode 602 may be composed of a metal-containing material or a Si-containing material, such as doped Si.

The electrode plate 600 is composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Furthermore, electrode plate 600 may include a protective layer formed on an exterior surface arranged to be exposed to plasma.

Figure 7:
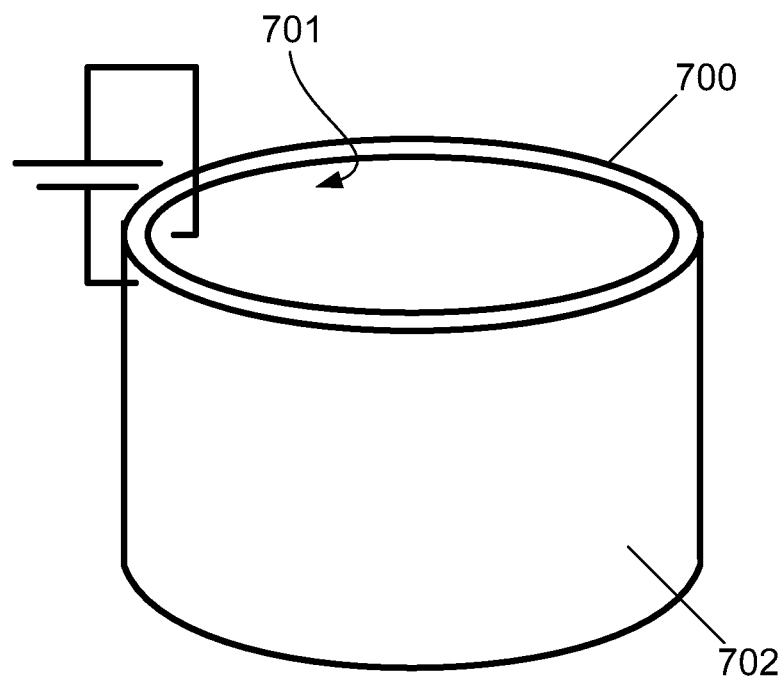
FIG. 7 provides an illustration of a deposition shield and a method of fabricating according to an embodiment.

Referring now to FIG. 7, a deposition shield 700 and a method of fabricating thereof are illustrated according to an embodiment. The deposition shield 700 is composed of a ferroelectric material, wherein a bias voltage may be applied across the ferroelectric material between a first electrode 701 and a second electrode 702. The first electrode 701 and the second electrode 702 may be composed of a metal-containing material or a Si-containing material, such as doped Si.

The deposition shield 700 is composed of a ferroelectric material, such as a material having a chemical formula expressed as $A_x(B_yC_{1-y})O_z$, where A, B, C are metals and x, y, and z are positive real numbers. The ferroelectric material may include barium titanate ($BaTiO_3$) or lead zirconate titante (PZT). Furthermore, deposition shield 700 may include a protective layer formed on an exterior surface arranged to be exposed to plasma.

Figure 8:
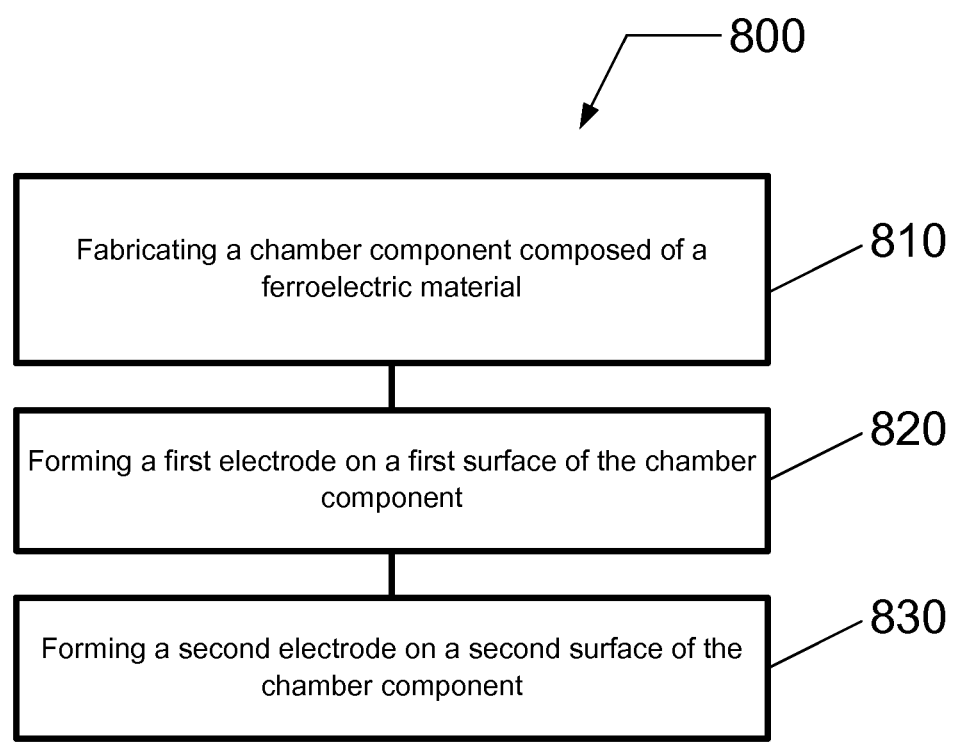
FIG. 8 provides a flow chart illustrating a method of manufacturing a replaceable chamber element according to another embodiment.

Referring now to FIG. 8, a method for manufacturing a replaceable chamber element for use in a plasma processing system is described according to another embodiment. The method includes flow chart 800 beginning in 810 with fabricating a chamber component composed of a ferroelectric material.

In 820, a first electrode is formed on a first surface of the chamber component.

In 830, a second electrode is formed on a second surface of the chamber component, wherein the ferroelectric material is disposed essentially between the first electrode and the second electrode.

Furthermore, a protective layer may be formed on an exterior surface of the chamber component, wherein the protective layer is arranged to be exposed to plasma.

Figure 9:
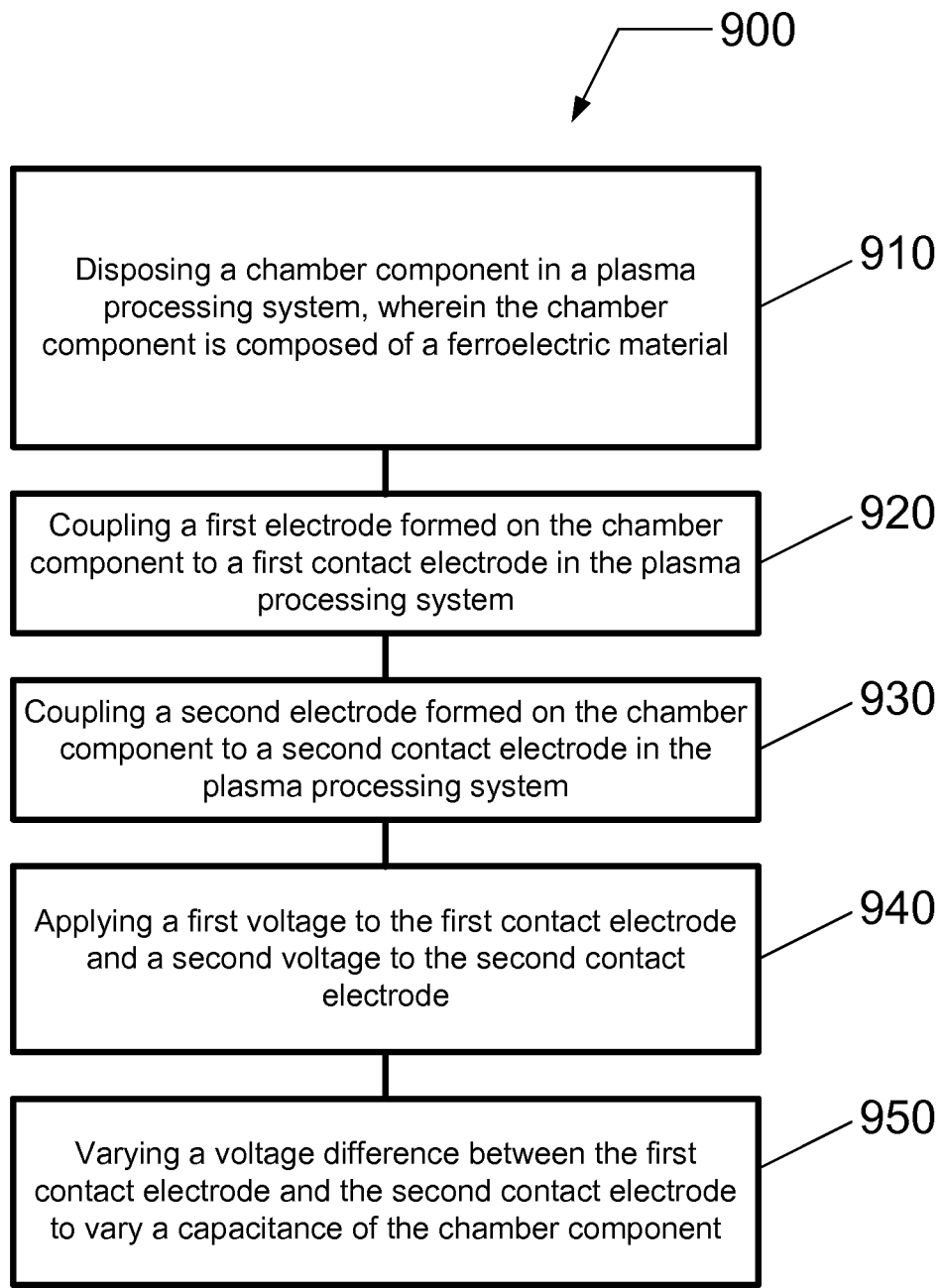
FIG. 9 provides a flow chart illustrating a method of performing a plasma-assisted process according to yet another embodiment.

Referring now to FIG. 9, a method for performing a plasma-assisted process in a plasma processing system is described according to another embodiment. The method includes flow chart 900 beginning in 910 with disposing a chamber component in a plasma processing system, wherein the chamber component is composed of a ferroelectric material.

In 920, a first electrode formed on the chamber component is contacted to a first contact electrode in the plasma processing system.

In 930, a second electrode formed on the chamber component is contacted to a second contact electrode in the plasma processing system.

The method may additionally include, as in 940, applying a first voltage to the first contact electrode and a second voltage to the second contact electrode. The method may further include, as in 950, varying a voltage difference between the first contact electrode and the second contact electrode to vary a capacitance of the chamber component. For example, a capacitance of the chamber component may be varied to increase a lifetime of the chamber component, improve matching between a first plasma processing chamber and a second plasma processing chamber, compensate for a drift in the plasma-assisted process from one substrate to another substrate, or reduce the seasoning time following the cleaning of the plasma processing system, or any combination of two or more thereof.

When a voltage difference is applied across the ferroelectric material of the chamber component (e.g., focus ring, shield ring, chamber liner, baffle plate, bellows shield, electrode plate, or antenna window), the capacitance of the chamber component may be varied. By adjusting the capacitance of the chamber component, at least one property of the plasma (e.g., RF current proximate the substrate) may be controlled continuously or non-continuously, which permits achieving a desirable plasma profile (or etch profile, deposition profile, etc.). The ability to vary the capacitance of a chamber component allows for adjustment of plasma properties, including plasma uniformity (or etch uniformity).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A replaceable chamber element for use in a plasma processing system, comprising:
    a chamber component configured to be exposed to plasma in a plasma processing system, said chamber component being fabricated of a ferroelectric material; and
    wherein said chamber component includes a first electrode configured to be coupled to a first contact electrode at a first voltage, and a second electrode configured to be coupled to a second contact electrode at a second voltage.

2. The replaceable chamber element of claim 1, wherein said chamber component comprises a focus ring, a shield ring, a chamber liner, a baffle plate, an electrode plate, or an antenna window.

3. The replaceable chamber element of claim 1, wherein said ferroelectric material includes a chemical formula expressed as $A_x(B_yC_{1-y})O_z$, where A, B, C are metals and x, y, and z are positive real numbers.

4. The replaceable chamber element of claim 1, wherein said ferroelectric material includes barium titanate ($BaTiO_3$) or lead zirconate titante (PZT).

5. The replaceable chamber element of claim 1, wherein said chamber component includes a protective layer formed on a surface to be exposed to plasma.

6. The replaceable chamber element of claim 5, wherein said protective layer contains Si.

7. The replaceable chamber element of claim 5, wherein said protective layer is a spray coating containing a Group III element in the Periodic Table.

8. The replaceable chamber element of claim 1, further comprising:
a voltage source having a first terminal coupled to said first contact electrode and a second terminal coupled to said second contact electrode, wherein a voltage difference between said first terminal and said second terminal is used to vary a dielectric constant of said ferroelectric material.

9. A method for manufacturing a replaceable chamber element for use in a plasma processing system, comprising:
fabricating a chamber component composed of a ferroelectric material;
forming a first electrode on a first surface of said chamber component; and
forming a second electrode on a second surface of said chamber component, said ferroelectric material is disposed essentially between said first electrode and said second electrode.

10. The method of claim 9, further comprising:
forming a protective layer on an exterior surface of said chamber component, wherein said protective layer is arranged to be exposed to plasma.

11. A method for performing a plasma-assisted process, comprising:
disposing a chamber component in a plasma processing system configured to generate plasma, said chamber component being composed of a ferroelectric material; and
forming plasma for performing a plasma-assisted process in said plasma processing system; and
varying a capacitance of said chamber component to adjust at least one property of said plasma in said plasma processing system, said at least one property including a plasma uniformity or an etch uniformity.

12. The method of claim 11, wherein said ferroelectric material includes a chemical formula expressed as $A_x(B_yC_{1-y})O_z$, where A, B, C are metals and x, y, and z are positive real numbers.

13. The method of claim 11, wherein said ferroelectric material include barium titanate ($BaTiO_3$) or lead zirconate titante (PZT).

14. A method for performing a plasma-assisted process, comprising:
disposing a chamber component in a plasma processing system configured to generate plasma, said chamber component being composed of a ferroelectric material;
forming plasma for performing a plasma-assisted process in said plasma processing system;
coupling a first electrode formed on said chamber component to a first contact electrode in said plasma processing system;
coupling a second electrode formed on said chamber component to a second contact electrode in said plasma processing system;
applying a voltage difference across said ferroelectric material between said first electrode and said second electrode by coupling a first voltage to said first contact electrode and a second voltage to said second contact electrode; and
varying said voltage difference between said first contact electrode and said second contact electrode to vary said capacitance of said chamber component.

15. The method of claim 14, further comprising varying a capacitance of said chamber component to increase a lifetime of said chamber component, improve matching between a first plasma processing chamber and a second plasma processing chamber, compensate for a drift in said plasma-assisted process from one substrate to another substrate, or compensate for a drift in said plasma-assisted process from one lot of substrates to another lot of substrates, or any combination of two or more thereof.

* * * * *